United States Patent
Blednov et al.

(10) Patent No.: US 7,119,623 B2
(45) Date of Patent: Oct. 10, 2006

(54) OUTPUT CIRCUIT FOR A SEMICONDUCTOR AMPLIFIER ELEMENT

(75) Inventors: Igor Ivanovich Blednov, Nijmegen (NL); Alle Kornelis Vennema, Greenville, RI (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/502,790

(22) PCT Filed: Jan. 30, 2003

(86) PCT No.: PCT/IB03/00330

§ 371 (c)(1),
(2), (4) Date: Jul. 27, 2004

(87) PCT Pub. No.: WO03/065569

PCT Pub. Date: Aug. 7, 2003

(65) Prior Publication Data

US 2005/0083723 A1    Apr. 21, 2005

(30) Foreign Application Priority Data

Feb. 1, 2002  (EP) .................................. 02075419

(51) Int. Cl.
*H03F 3/191* (2006.01)

(52) U.S. Cl. ...................................... 330/302; 330/292
(58) Field of Classification Search ................ 330/292, 330/301, 302, 306
See application file for complete search history.

(56) References Cited

U.S. PATENT DOCUMENTS 6,724,255 B1 * 4/2004 Kee et al. .................... 330/251

OTHER PUBLICATIONS

"Class-F power amplifiers with maximally flat wave forms" by Frederic H. Raab. IEEE Transactions on Microwave Theory and Techniques, vol. 45, No. 11, Nov. 1997.

* cited by examiner

*Primary Examiner*—Steven J. Mottola
(74) *Attorney, Agent, or Firm*—Aaron Waxler; Paul Im

(57) ABSTRACT

An output circuit for a semiconductor amplifier element having an output capacitance (20, 42) that is to be cancelled by a first LC circuit having a first inductance (22, 44) and a first capacitance (24, 46), said output circuit comprising an additional inductance circuit with an additional inductance (30, 52) and an additional capacitance (32, 54), said first inductance circuit and said additional inductance circuit compensating for the output capacitance (20, 42) of the semiconductor amplifier element, while the first inductance (22, 44) and the first capacitance (24, 46) cancel out the second harmonics within the output signal of the semiconductor amplifier element.

10 Claims, 4 Drawing Sheets

OUTPUT CIRCUIT FOR A SEMICONDUCTOR AMPLIFIER ELEMENT

The invention relates to an output circuit for a semiconductor amplifier element having an output capacitance that is to be cancelled by a first LC circuit having a first inductance and a first capacitance.

Within RF power amplifiers, the output capacitance of the amplifier element is usually cancelled with a so-called "inshin" circuit (inshin=built-in shunt inductance). An "inshin" circuit is a serial circuit which consists of an inductance which is embodied by several built-in bond wires connected in parallel and a capacitance. This LC circuit is used in most devices with a parasitic output capacitance which has a negative effect on the device performance by adding a frequency-dependent component to the device output impedance. This undesired effect is eliminated in high-power devices by adding the inductance in parallel to the device output, the inductance having a value providing a parallel resonant circuit together with the output capacitance in the operational frequency band or in proximity of the operational frequency band of the power amplifier. The imaginary part of the output impedance in this way can be completely compensated for or reduced by the inductance. The inductance is connected to ground through a large interdigital capacitance to prevent a DC current through the inductance.

FIG. 1 shows a power transistor having a state of the art compensation circuit. The signal input terminal 2 is connected to the transistor 4 via a gate terminal 5 of the transistor 4. An output capacitance 6 of the transistor 4 is connected in parallel to the output of the transistor 4. The output capacitance 6 is connected between a drain contact 7 and a source contact 9 which is also connected to ground. In order to eliminate the negative effect of the output capacitance 6, a serial circuit which consists of the inductance 8 and the capacitance 10 is connected in parallel to the output of the transistor 4. The output capacitance 6 and the inductance 8 form a parallel resonant circuit with a resonance frequency located at the center of the operational or fundamental signal frequency Fo or in proximity of the operational frequency band of the power amplifier, in order to decrease the imaginary part of the output impedance of the transistor 4. The capacitance 10 prevents a DC current from flowing to ground.

An inductance 12 is connected between the output of the transistor 4 and a signal output terminal 14. If all the component of the inshin circuit are properly selected, they provide together with the inductance 12 a very flat output impedance in the frequency band. Such a compensated port can be matched to the load in a wide frequency band.

Some applications of the devices require a value of the inductance which cannot be achieved with the inshin circuit configuration of the state of the art. The value of the inductance in its known design, consisting of one or more inductively coupled gold wires with regular spacing, is limited by technology or design restrictions, such as gold wire thickness, spacing, and quantity, and also by the reliability of the device.

Some of the restrictions of the bond wires forming the inductance are that the loop height and the length of gold bond wires are limited by the mechanical strength of the bond wires and assembly equipment limitations, and the minimum quantity of the gold bond wires is limited by the maximum current which flows through the bond wires. A mismatch at the transistor output at some specific phase of reflection can cause a very high current through the inductance, which will destroy the bond wires of the inductance. The maximum quantity of the gold bond wires is limited by the available space, assembly equipment, and required inductance value to be achieved. Last but not least, the diameter of the gold wire has to match to the general assembly rules and assembly equipment;

The object of the invention is to provide an output circuit for a semiconductor amplifier element having fewer restrictions as regards a higher achievable compensating inductance in applications with high-power devices (Pout>100 W).

To achieve this object, the output circuit of the invention comprises a second inductance circuit comprising a second inductance and a second capacitance, wherein said first inductance circuit and said second inductance circuit are configured to compensate for the output capacitance of the semiconductor amplifier element, and the first inductance and the first capacitance are configured to suppress the undesired harmonics within the output signal of the semiconductor amplifier element. The combined effect of the first inductance and first capacitance and second inductance and second capacitance provide an improved amplifier device performance by appropriate upper harmonic termination and better conditions for wide-band output matching. For example, a short-circuit for the second harmonic of the fundamental (2Fo) provided by the first inductance in series with the first capacitance can significantly improve the device efficiency at high power. Besides the improved performance, the inductance value can be increased without decreasing its maximum current capability.

Further advantages of the output circuit for a semiconductor amplifier element f the invention are:
- the termination of undesired current harmonics in the output signal by canceling of the undesired harmonics of the output signal of the semiconductor amplifier element for better device performance;
- the improved possibility of compensating for the output parasitic capacitance of the semiconductor amplifier element;
- the high current capability of the compensating inductance, providing higher device reliability,
- considerably improved and wide-band power supply decoupling conditions; and
- a minimum of space for amplifier design.

According to a preferred embodiment of the invention, an output circuit in which the first inductance is connected to the output of the semiconductor amplifier element and the first capacitance is connected between the first inductance and ground according to the object of the invention is provided, wherein the second inductance is connected to a node between the first inductance and the first capacitance and to the second capacitance which is connected to ground. The network of the first inductance, the second inductance, the first capacitance, and the second capacitance provides a short circuit termination at the required frequency for the second or third harmonic of the fundamental signal frequency Fo. Parallel to this function, the network provides a compensation of the output capacitance of the semiconductor amplifier device.

According to a preferred embodiment of the invention, the output circuit comprises a power supply which is connected to a node between the second inductance and the second capacitance. The solution having additional leads for power supply is advantageous in terms of low resistance and low frequency, and the most wide-band decoupling possible for the power amplifier supply, which may go as high as 20 MHz, if required. Furthermore, this embodiment provides the smallest possible occupied area in application design for the power amplifier. This feature of the device that the power supply is provided through the compensating inductance provides the best decoupling conditions in a wide frequency band for digitally modulated signals like CDMA, WCDMA and EDGE;

According to a preferred embodiment of the invention, the output circuit comprises a further LC circuit which is connected between the second inductance and the second capacitance, said further LC circuit comprising a further inductance and a further capacitance, wherein the further inductance is connected to a node between the second inductance and the second capacitance and to the further capacitance which is connected to ground. This further LC circuit is used for decoupling the power supply in order to achieve the required wide-band and low-impedance performance of the power supply.

According to a preferred embodiment of the invention, the output circuit comprises a power supply which is connected to a node between the third inductance and the third capacitance. This again has the advantage that the power supply is provided through the compensating inductance, which provides the best decoupling conditions in a wide frequency band for digitally modulated signals like CDMA, WCDMA and EDGE.

According to a preferred embodiment of the invention, the output circuit is arranged such that the first inductance and the first capacitance form a series resonator. The first inductance and the first capacitance can provide a short-circuit termination at the required frequency for the second or third harmonic of the fundamental signal frequency Fo. This termination of a given harmonic leads to an improved performance/efficiency or linearity of the semiconductor amplifier device.

According to a preferred embodiment of the invention, the output circuit comprises said capacitances in the form of combinations of insulating layers and conductive layers on a substrate on which said output circuit is formed. This helps to implement the circuit of the invention and helps to save expense and time in production.

According to a preferred embodiment of the invention, the output circuit comprises inductances which are formed by bond wires. Thus, the value of the inductances can be easily matched to the necessary value required by the present invention. The bond wires of the output circuit are provided between the semiconductor amplifier element and the capacitances on the substrate of the circuit or the output terminal of the circuit.

According to a preferred embodiment of the invention, said semiconductor amplifier element is a transistor.

According to a preferred embodiment of the invention, the LC circuits are built-in shunt LC circuits. This minimizes the surface area of the circuit and reduces expense caused by integrated devices.

These and various other advantages and features of novelty which characterize the present invention are pointed out with particularity in the claims annexed hereto and forming a part hereof However, for a better understanding of the invention, its advantages, and the object obtained by its use, reference should be made to the drawings which form a further part hereof, and to the accompanying descriptive matter in which preferred embodiments of the present invention are illustrated and described.

Figure 1:
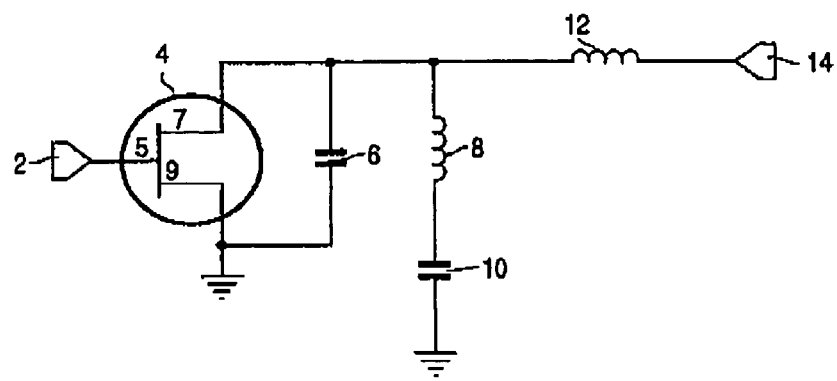
FIG. 1 is a representation of an output circuit for a power transistor having a state of the art compensation circuit.
Figure 2:
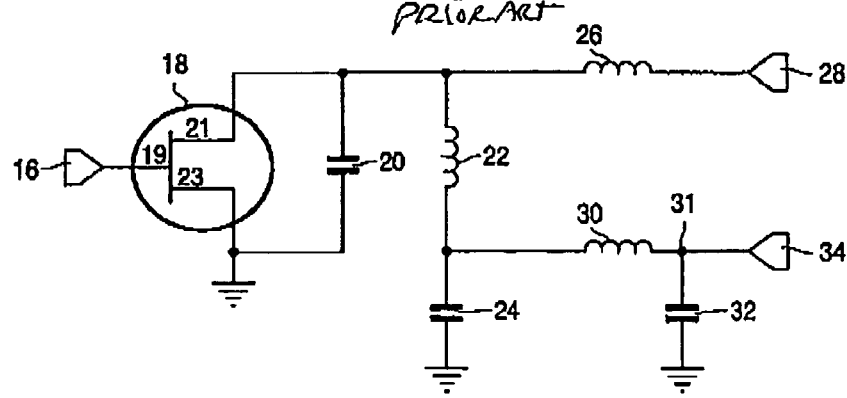
FIG. 2 is a circuit diagram of an output circuit for a power transistor with a compensation circuit according to the present invention.

FIG. 2 is a circuit diagram of a power transistor with a compensation circuit. The circuit diagram comprises a signal input terminal 16 which is connected to a gate terminal 19 of the transistor 18. An output capacitance 20 is connected in parallel to the drain terminal 21 and the source terminal 23 of the transistor 18. The source terminal 23 is connected to ground. A serial circuit is connected in parallel to the output capacitance 20 of the transistor 18. The serial circuit comprises the inductance 22 and the capacitance 24. The inductance 30 is connected on the one side between the inductance 22 and the capacitance 24 and on the other side to a capacitance 32 and a power supply lead 34. The capacitance 32 is connected between the inductance 30 and ground. The power supply lead 34 is connected to a node 31 between the inductance 30 and the capacitance 32. The inductance 26 is connected between the drain terminal 21 of the transistor 18 and the signal output terminal 28.

The circuit which comprises the inductances 22 and 30 and the capacitances 24 and 32 compensates the output capacitance 20 of the transistor 18. Beside the effect that the parasitic capacitance 20 is diminished, the possible operational frequency band of the device is widened by this network, because this network significantly lowers the imaginary part of the transistor output impedance, as will be shown in FIG. 5 and FIG. 6. Providing a parallel resonance together with the output capacitance 20 of the transistor 18 at the operating frequency Fo, the real part of the transistor output impedance Zout increases at the same time. This helps to match the transistor to the load, because the required transformation ratio of the output matching circuit is less.

The serial circuit, which comprises the inductance 22 and the capacitance 24, forms a serial resonator which is connected in parallel to the output capacitance 20 of the transistor 18. With properly selected values the components 22 and 24 can provide a short-circuit termination at the required frequencies, for example the second or third harmonic of the fundamental signal Fo. This termination of the required harmonics leads to an improved performance of the transistor 18. The effect of this kind of termination of required frequencies is discussed in the paper of IEEE Transactions on Microwave Theory and Techniques, vol. 45, no. 11, November 1997, "Class-F power amplifiers with maximally flat wave forms" by Frederic H. Raab.

Wireless communication systems operate with modulation signals, for example CDMA, and especially WCDMA. The spectrum of these signals is located in a bandwidth of up to 20 MHz, and the modulated RF signal has a peak-to-average-ratio of up to 16 dB. Power amplification of such a RF signal with a variable envelope requires proper power supply conditions for RF transistors in transmitters. The solution with an additional lead for power supply has the advantage that a low impedance of the decoupling through compensating inductances in the band up to 20 MHz is offered, in this way providing a high linearity of the amplifier. Furthermore, the solution provides for the smallest possible occupied surface area in an application designed amplifier.

Figure 3:
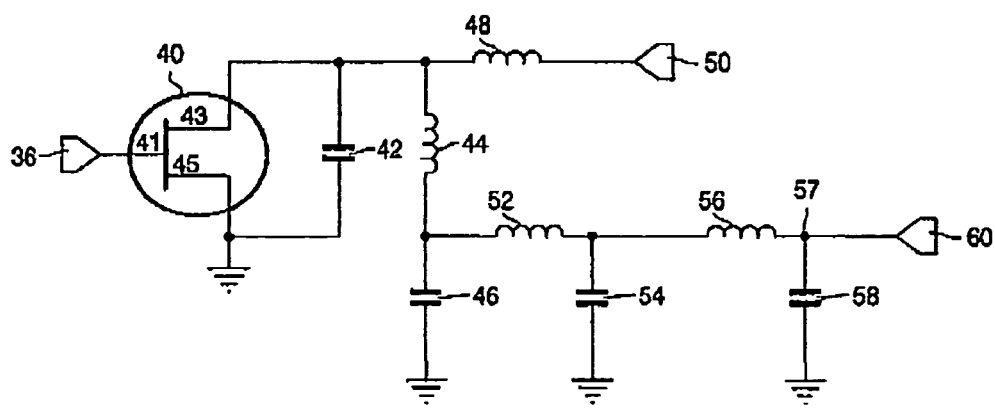
FIG. 3 is an output circuit for a power transistor with a compensation circuit and a decoupling circuit according to the present invention.

FIG. 3 is a circuit diagram of the power transistor with a compensation circuit according to the present invention having an additional transistor power supply decoupling circuit. The circuit has a signal input terminal 36 which is connected to a gate terminal 41 of the transistor 40. The output capacitance 42 is connected in parallel to a drain terminal 43 and a source terminal 45 of the transistor 40. The source terminal 45 is connected to ground. A serial circuit is connected in parallel to the output capacitance 42 of the transistor 40. The serial circuit comprises an inductance 44 and a capacitance 46. The capacitance 46 is connected between the inductance 44 and ground.

An inductance 52 is connected on the one side between the inductance 44 and the capacitance 46 and on the other side to a capacitance 54 and a inductance 56. The capacitance 54 is connected between the inductance 52 and ground. A decoupling circuit is connected between the inductance 52 and the capacitance 54. The decoupling circuit is a serial circuit which comprises an inductance 56 and a capacitance 58. The capacitance 58 is connected between the inductance 56 and ground. A power supply lead 60 is connected to a node 57 between the inductance 56 and the capacitance 58. An inductance 48 is connected between the drain terminal 43 of the transistor 40 and a signal output terminal 50.

The circuit of FIG. 3 differs from the circuit of FIG. 2 in the decoupling circuit comprising the inductance 56 and the capacitance 58. The purpose of the decoupling circuit is to achieve the required wide-band and low-impedance performance of transistor power supply decoupling. This is made possible by the inductance 56 and the capacitance 58 of the decoupling circuit. The decoupling circuit has ideal properties for such a function because it is arranged very close to the power transistor die. Furthermore, the decoupling circuit has a capacitance with extremely low parasitic elements, provides low impedance in a wide frequency band, and is directly connected to the drain or collector of the transistor through the wires of the compensation network, which in combination can provide the lowest possible impedance at base band frequencies of up to 30 MHz. The impedance graphs are presented in FIG. 7 and FIG. 8 below.

The capacitance 58 is a combination of several parallel capacitors and comprises ceramic capacitors with an appropriate operational frequency band covering the base band of the communication system in order to decouple the power supply. The capacitor's resonance frequency is far off or outside the base band.

The location of the capacitance 58 is also as close as possible to the power supply leads of the amplifier elements. This provides a small value for the inductance 56, which will be smaller than 5 nH, and a low impedance of the decoupling circuit in a wide frequency band. The power supply should have an output impedance which is smaller than 0.1 Ω for up to the lowest specified frequency of the base band.

Figure 4:
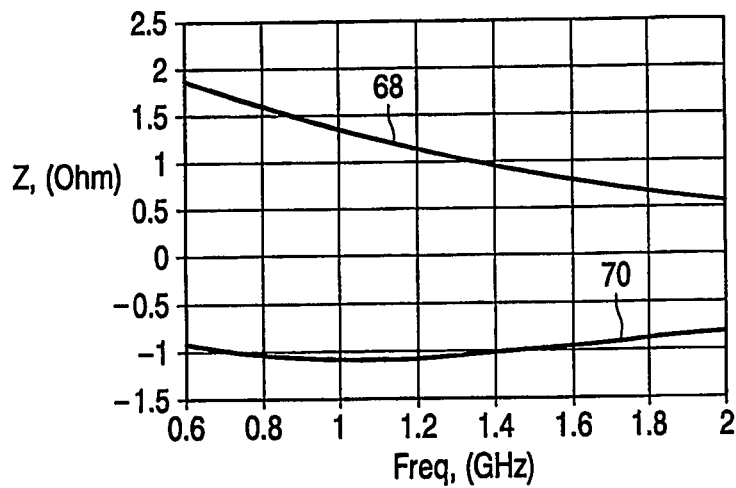
FIG. 4 is a diagram of the impedance of an output circuit for the power transistor without compensation circuit at the output terminal.

FIG. 4 shows an example of an output impedance which is provided by an amplifier device without compensation. Curve 68 represents the real part of the output impedance, and curve 70 represents the imaginary part of the output impedance of the amplifier device. It is to be noted that the imaginary part of the amplifier device shown by curve 70 is rather high compared with the curves of the imaginary part in FIGS. 5 and 6.

A high imaginary part is not desired for a wide-band efficiency of a transistor.

Figure 5:
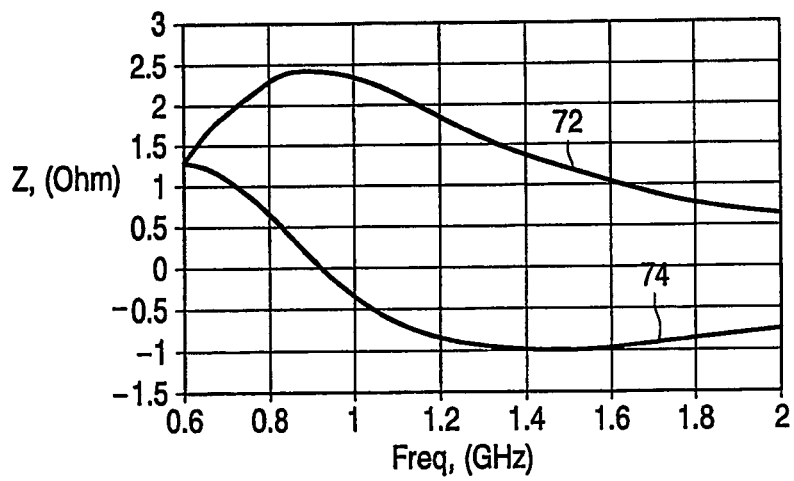
FIG. 5 is a diagram of the impedance of an output circuit for the power transistor having a compensation circuit of the state of the art at 900 MHz.

FIG. 5 shows the output impedance of the amplifier device with a compensation circuit of the state of the art at 900 MHz. Curve 72 represents the real part of the output impedance, and curve 74 shows the imaginary part of the output impedance at 900 MHz. The imaginary part of the output impedance is almost zero close to 900 MHz. Also, the real part of the output impedance is higher than the real part in FIG. 4 at 900 MHz. The advantage of a high real part and a low imaginary part is that the output can be matched more easily to a subsequent circuit component.

Figure 6:
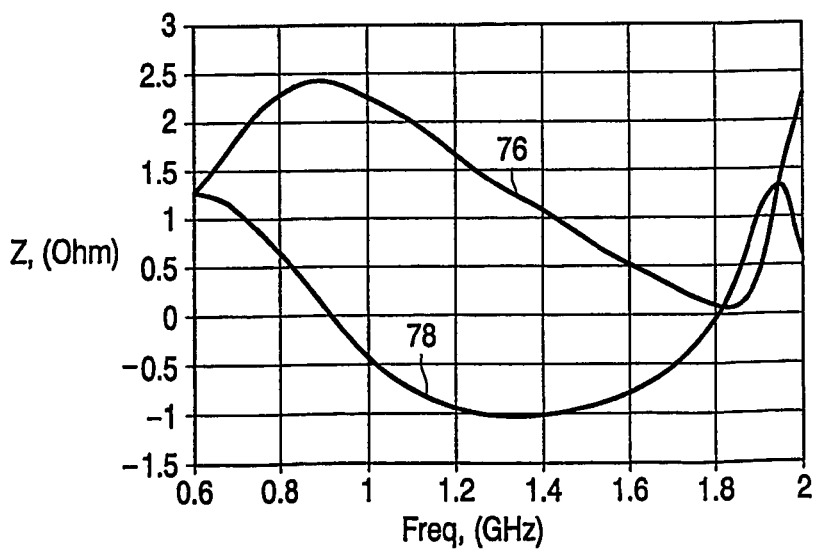
FIG. 6 is a diagram of the impedance of an output circuit for the power transistor having a compensation circuit at the output terminal with second harmonic termination according to the present invention.

FIG. 6 shows the output impedance of an amplifier device with a compensation circuit at the output according to the present invention. Curve 76 shows the real part, and curve 78 shows the imaginary part of the output impedance. The amplifier device is a 90 W RF power transistor which operates at Fo=900 MHz with the compensating circuit according to the present invention, which is connected to the transistor output. The compensating circuit provides a third circuit for the second harmonic 2 Fo=1.800 MHz. It is to be noted that the imaginary part which is represented by curve 78 is almost zero near 900 MHz and is also close to zero at 1.8 GHz. The real part, which is shown by curve 76, has a maximum of roughly 2.4 Ω at 900 MHz and a minimum of roughly 0.1 Ω at 1.8 GHz. The shown conditions of the real part improve the efficiency of the amplifier element. Furthermore, the matching of the subsequent circuit components is made much easier by a maximum of the real part at 900 MHz.

Figure 7:
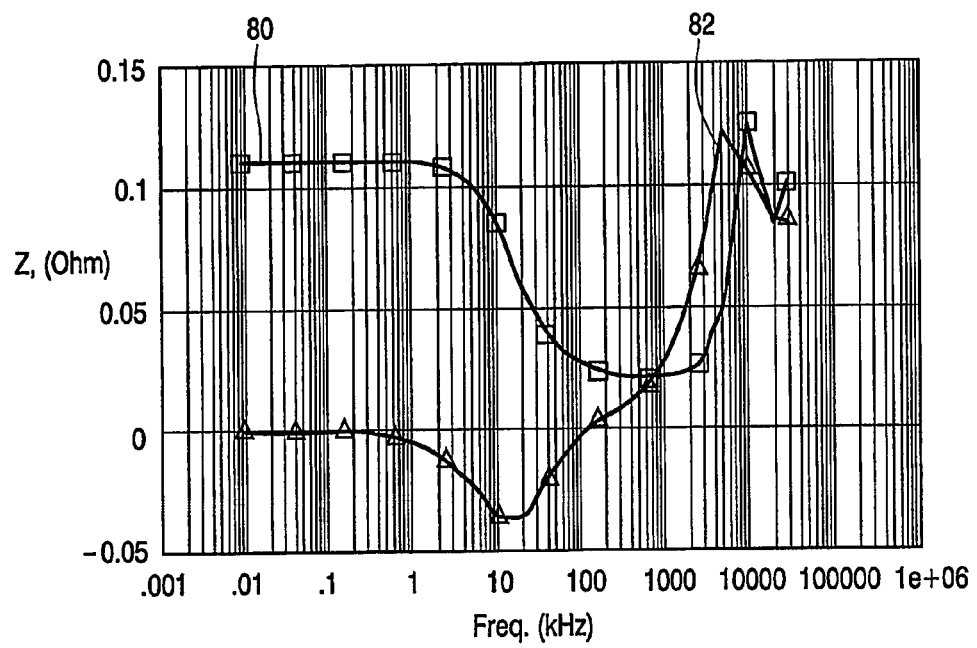
FIG. 7 is a diagram of the impedance of the power supply decoupling circuit through the compensating inductance seen by a transistor drain according to the present invention.

FIG. 7 shows the output impedance of the amplifier element with a power supply decoupling circuit according to the present invention. The decoupling circuit has an inductance of 3 nH and an output impedance of the power supply of 0.12 Ω. The curve 80 shows the real part of the output impedance, and the curve 82 shows the imaginary part of the output impedance of the amplifier element. The output impedance is below 0.12 Ω in the band of 0.01 kHz to 30 MHz, on condition that the decoupling capacitance 58 is connected directly to the power supply leads of the amplifier element and the power supply has an output impedance smaller than 0.1 Ω at the low-frequency band of the specified base band.

Figure 8:
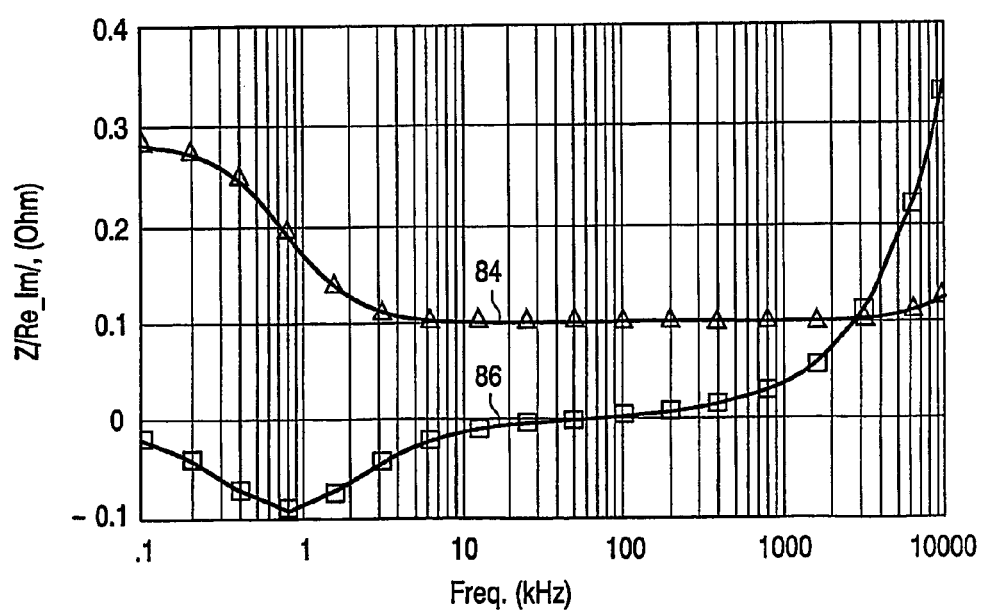
FIG. 8 is a diagram of the decoupling circuit impedance seen by a transistor drain at a higher inductance than in FIG. 7 and a higher output impedance of the power supply at a low-frequency edge of the base band according to the present invention.

FIG. 8 shows the output impedance of a decoupling circuit when the inductance 56 has an increased inductance of 30 nH and the output impedance of the power supply has an increased value of 0.25 Ω at low frequencies compared to FIG. 7. The curve 84 shows the real part of the output impedance, and the curve 86 shows the imaginary part of the output impedance. The maximum of the real part is at roughly 0.28 Ω in the shown frequency spectrum from 0.1 kHz up to 10000 kHz. The values of curve 84 are in general higher than the values of curve 80 in FIG. 7. The advantage of a high value of the real part is a better matching condition for the connected circuit components. The values of the imaginary part shown by curve 86 are also increased by the higher inductance of 30 nH and the higher output impedance of the power supply of 0.25 Ω, but the imaginary part is close to zero in the range of 10 kHz to 1000 kHz and therefore can be disregarded in this frequency band for matching conditions.

Figure 9:
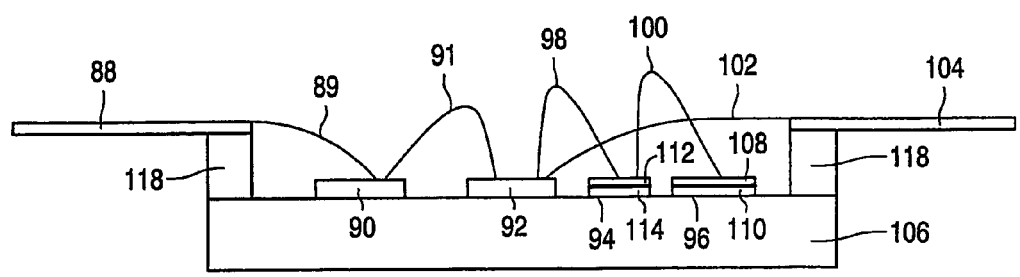
FIG. 9 is a cross-sectional view of a transistor output design with a suggested output circuit configuration.

FIG. 9 shows an example of a transistor design with the output circuit configuration of the present invention. The design comprises a gate lead 88 connected to a prematch cap 90 via a bond wire 89. The prematch cap 90 is connected via a bond wire 91 to a transistor die 92. The transistor die 92 is connected via a bond wire 98, which at the same time forms an inductance, to a capacitance 94. The bond wire 98 and the capacitance 94 form a serial circuit to shorten the desired harmonics of the operational frequency, thus improving the performance of the transistor 92. The capacitance 94 is connected to a capacitance 96 via the bond wire 100, which at the same time forms an inductance. The bond wires 98 and 100 and the capacitances 94 and 96 compensate the output capacitance of the transistor 92. The transistor die 92 is connected via a bond wire 102, which forms an inductance, to a drain lead 104. The inductance of the bond wire 102 flattens the output impedance.

The capacitances 94 and 96 are formed by combination of insulating layers 110 and 114 and conductive layers 108 and 112 on a substrate 106 on which said output circuit is formed. The substrate 106 is a thermally and electrically conductive layer and is connected to ground.

As shown in FIG. 9, the gate lead 88 and the drain lead 104 are mounted on the substrate 106 by means of a spacer frame 18 made of an insulating material.

Figure 10:
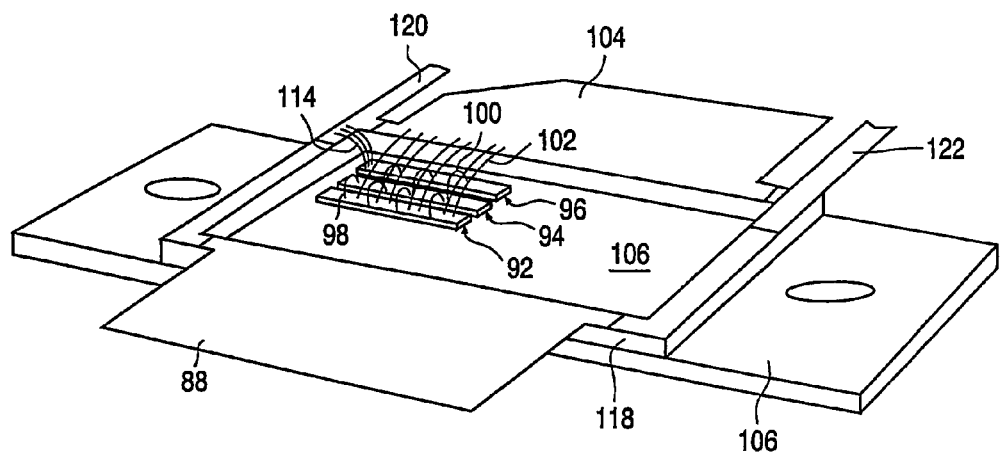
FIG. 10 is a perspective view of the output circuit for the power transistor of FIG. 9.

FIG. 10 is a perspective view of the output circuit for the power transistor of FIG. 9, where the prematch cap 90 of FIG. 9 and the bond wires connecting the prematch cap to the gate lead 88 and the transistor 92 are not shown for the sake of clarity. As is shown in FIG. 10, power supply leads 120, 122 are connected to the frame 118. The power supply lead 120 is connected to the capacitance 96 by three bond wires, one of which is bond wire 114. In the example of FIG. 10, there are four bond wires connecting the transistor 92 to the capacitance 94, one of which is bond wire 98, there are four bond wires connecting the capacitor 94 to the capacitance 96, one of which is bond wire 100, and there are seven bond wires connecting the transistor 92 to the drain lead 104, one of which bond wire 102. As was stated above, the number of bond wires between the various components of the device and the physical characteristics of the bond wires are selected with a view to achieving the desired properties of the inductances which they are to provide.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without departing from the scope of the invention. The scope of the invention is, of course, defined in the terms in which the appended claims are expressed.

The invention claimed is:

1. An output circuit for a semiconductor amplifier element having an output capacitance (20, 42) that is to be cancelled out by a first LC circuit having a first inductance (22,44) and a first capacitance (24, 46), said output circuit comprising an additional inductance circuit comprising an additional inductance (30, 52) and an additional capacitance (32, 54), said first inductance circuit and said additional inductance circuit compensating for the output capacitance (20, 42) of the semiconductor amplifier element, while the first inductance (22,44) and the first capacitance (24, 46) suppress the second harmonics within the output signal of the semiconductor amplifier element, wherein the additional inductance is connected to a node between the first inductance and the first capacitance.

2. An output circuit as claimed in claim 1, in which the first inductance (22, 44) is connected to the output of the semiconductor amplifier element and the first capacitance (24, 46) is connected between the first inductance (22, 44) and ground, wherein the additional inductance (30) is connected to a node between the first inductance (22, 44) and the first capacitance (24, 46) and to the additional capacitance (32) which is connected to ground.

3. An output circuit as claimed in claim 2, wherein a power supply is connected to a node between the second inductance (30) and the second capacitance (32).

4. An output circuit as claimed in claim 1, comprising a further LC circuit connected between the second inductance (30, 52) and the second capacitance (32, 54), said further LC circuit comprising a third inductance (56) and a third capacitance (58), wherein the third inductance (56) is connected to a node between the second inductance (52) and the second capacitance (54) and the third capacitance (58) which is connected to ground.

5. An output circuit as claimed in claim 2, wherein a power supply is connected to a node (57) between the third inductance (56) and the third capacitance (58).

6. An output circuit as claimed in claim 1, wherein the first inductance (22, 44) and the first capacitance (24, 46) form a series resonator.

7. An output circuit as claimed in claim 1, wherein said capacitances are fanned by combinations of insulating layers (110, 114) and conductive layers (108, 112) on a substrate (106) on which said output circuit is formed.

8. An output circuit as claimed in claim 1, wherein the inductances are formed by one or more inductively coupled bond wires (98, 100, 102).

9. An output circuit as claimed in claim 1, wherein said semiconductor amplifier element is a transistor.

10. An output circuit as claimed in claim 1, wherein the LC circuits are built-in shunt LC circuits.

* * * * *